US012803459B2

(12) United States Patent
Ito

(10) Patent No.: US 12,803,459 B2
(45) Date of Patent: Nov. 17, 2026

(54) POWER CONVERSION DEVICE

(71) Applicant: HONDA MOTOR CO., LTD., Tokyo (JP)

(72) Inventor: Shogo Ito, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 110 days.

(21) Appl. No.: 19/044,677

(22) Filed: Feb. 4, 2025

(65) Prior Publication Data

US 2025/0260335 A1 Aug. 14, 2025

(30) Foreign Application Priority Data

Feb. 8, 2024 (JP) ................................. 2024-017561

(51) Int. Cl.
*H05K 1/18* (2026.01)
*H02M 7/00* (2006.01)

(52) U.S. Cl.
CPC .............. *H02M 7/003* (2013.01); *H05K 1/18* (2013.01); *H05K 2201/10015* (2013.01); *H05K 2201/10272* (2013.01)

(58) Field of Classification Search
CPC .................... H02M 7/003; H05K 1/18; H05K 2201/10015; H05K 2201/10272
See application file for complete search history.

(56) References Cited

U.S. PATENT DOCUMENTS 11,088,649 B2 * 8/2021 Kitamura .............. B60L 15/007
12,665,523 B2 * 6/2026 Vu ........................ H02M 7/003

FOREIGN PATENT DOCUMENTS

JP 2021-129406 A 9/2021

* cited by examiner

*Primary Examiner* — Adolf D Berhane
(74) *Attorney, Agent, or Firm* — Rankin, Hill & Clark LLP

(57) ABSTRACT

A power conversion device includes a power conversion unit that converts three phase alternating-current power supplied from a three phase alternating-current power source into direct-current power, a first busbar connected to a first phase terminal of the power conversion unit and provided to an insulating substrate, a second busbar connected to second phase terminal of the power conversion unit and provided to the insulating substrate, and a third busbar connected to third phase terminal of the power conversion unit and provided to the insulating substrate, a first insulating layer is positioned on the second busbar, and the first busbar and the third busbar are positioned on the first insulating layer.

8 Claims, 9 Drawing Sheets

36

82

POWER CONVERSION DEVICE

CROSS-REFERENCE TO RELATED APPLICATIONS

This application is based upon and claims the benefit of priority from Japanese Patent Application No. 2024-017561 filed on Feb. 8, 2024, the contents of which are incorporated herein by reference.

BACKGROUND OF THE INVENTION

Field of the Invention

The present disclosure relates to a power conversion device.

Description of the Related Art

In recent years, efforts toward realization of low-carbon or decarbonized society have been activated, and research and development have been conducted on power conversion devices for reducing $CO_2$ emission and improving energy efficiencies also in moving objects including aircrafts.

JP 2021-129406 A discloses a power conversion device interposed between a battery and an alternating-current motor. The power conversion unit converts the direct-current power supplied from the battery into three-phase alternating-current power and outputs the three-phase alternating-current power to the three-phase alternating-current motor. The power conversion device includes a plurality of power cards (switching elements), a plurality of output busbars, and a plurality of external connection terminals. The U-phase power card is connected to the U-phase external connection terminal via the U-phase output busbar. Similarly, the V-phase power card is connected to the V-phase external connection terminal via the V-phase output busbar, and the W-phase power card is connected to the W-phase external connection terminal via the W-phase output busbar. Adjacent two output busbars are spaced from each other for insulation.

SUMMARY OF THE INVENTION

A better power conversion device is desired.

The present invention has the object of solving the aforementioned problem.

An aspect of the present disclosure is to provide a power conversion device including a power conversion unit configured to convert three-phase alternating-current power, which is supplied from a three-phase alternating-current power source, into direct-current power; an insulating substrate formed of an insulating material; a first busbar connected to a first phase terminal of the power conversion unit, the insulating substrate being provided with the first busbar; a second busbar connected to a second phase terminal of the power conversion unit, the insulating substrate being provided with the second busbar; and a third busbar connected to a third phase terminal of the power conversion unit, the insulating substrate being provided with the third busbar, wherein the insulating substrate includes a plurality of insulating layers, a first insulating layer of the plurality of insulating layers is positioned on the second busbar, the first busbar and the third busbar are positioned on the first insulating layer, and the first busbar, the second busbar, and the third busbar are mutually insulated by the insulating material forming the insulating substrate.

According to the present invention, a favorable power conversion device can be provided.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE INVENTION

It is desirable that a power conversion device provided, for example, in a moving object be small. Therefore, it is preferable that two busbars are disposed as close as possible in the power conversion device. The power conversion device according to the embodiment described below can reliably insulate a plurality of busbars from each other while shortening the distance therebetween.

A power conversion device 10 according to one embodiment will be described with reference to the drawings. In the present embodiment, a case where the power conversion device 10 is a power control unit will be described as an example, but the present invention is not limited thereto. The power control unit 10 is mounted on a moving object. In the present embodiment, a case where the moving object is an aircraft 12 will be described as an example, but the present invention is not limited thereto.

1 Configuration of Aircraft 12

Figure 1:
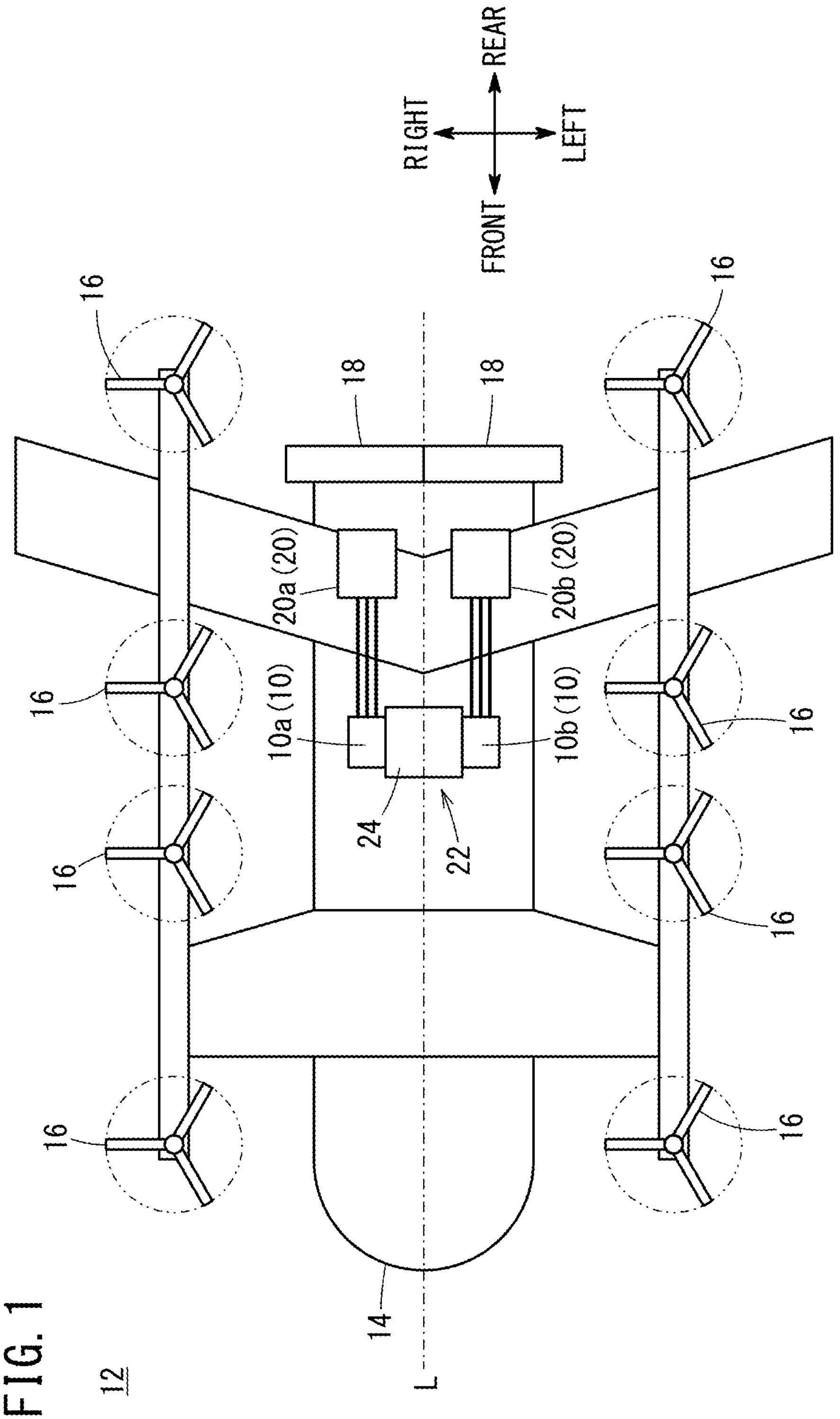
FIG. 1 is a schematic diagram of an aircraft.

FIG. 1 is a schematic diagram of an aircraft 12. The aircraft 12 according to the present embodiment is an electric vertical take-off and landing (eVTOL) aircraft. In the aircraft 12, electric motors drive rotors. The aircraft 12 generates a vertical thrust and a horizontal thrust by the rotors.

The aircraft 12 has an airframe 14. The aircraft 12 has eight VTOL rotors 16. The VTOL rotors 16 generate an upwardly directed thrust with respect to the airframe 14. The aircraft 12 includes two cruise rotors 18. The cruise rotors 18 generate a forwardly directed thrust with respect to the airframe 14.

The VTOL rotors 16 and the cruise rotors 18 are driven by electric motors (not shown). The aircraft 12 includes a generator 20 and a battery (not shown) as power sources of the electric motors. The electrical power supplied by the generator 20 is supplied to electric motors. The electrical power supplied by the generator 20 is stored in a battery (capacitor). In the case that the electrical power generated by the generator 20 is insufficient with respect to the required amount of electrical power, the electrical power stored in the battery is supplied to the electric motors.

2 Configuration of Power Supply Device 22

The aircraft 12 includes a power supply device 22. The power supply device 22 includes the generator 20, a power control unit 10, and a main junction box 24. Hereinafter, the power control unit 10 may be referred to as a PCU 10. The main junction box 24 may be referred to as an MJB 24.

Two generators 20 are provided for the power supply device 22. One of the two generators 20 is a first power generator 20*a*, and the other of the two generators 20 is a second power generator 20*b*. The first power generator 20*a* is disposed on the right side of the center line L in the lateral direction of the airframe 14 of the aircraft 12, and the second power generator 20*b* is disposed on the left side of the center line L.

The power supply device 22 has two PCUs 10. One of the two PCUs 10 is a first PCU 10*a*, and the other of the two PCUs 10 is a second PCU 10*b*. The MJB 24 is disposed about the center line L of the airframe 14. The first PCU 10*a* is attached to the right side surface of the MJB 24, and the second PCU 10*b* is attached to the left side surface of the MJB 24.

The three-phase alternating-current electrical power generated by the first power generator 20*a* is supplied to the first PCU 10*a*. The first PCU 10*a* converts the three-phase alternating-current electrical power supplied from the first power generator 20*a* into direct-current electrical power. The converted direct-current electrical power is supplied to the MJB 24.

The three-phase alternating-current electrical power generated by the second power generator 20*b* is supplied to the second PCU 10*b*. The second PCU 10*b* converts the three-phase alternating-current electrical power supplied from the second power generator 20*b* into direct-current electrical power. The converted direct-current electrical power is supplied to the MJB 24.

3 Configuration of Power Supply Device 22

Figure 2:
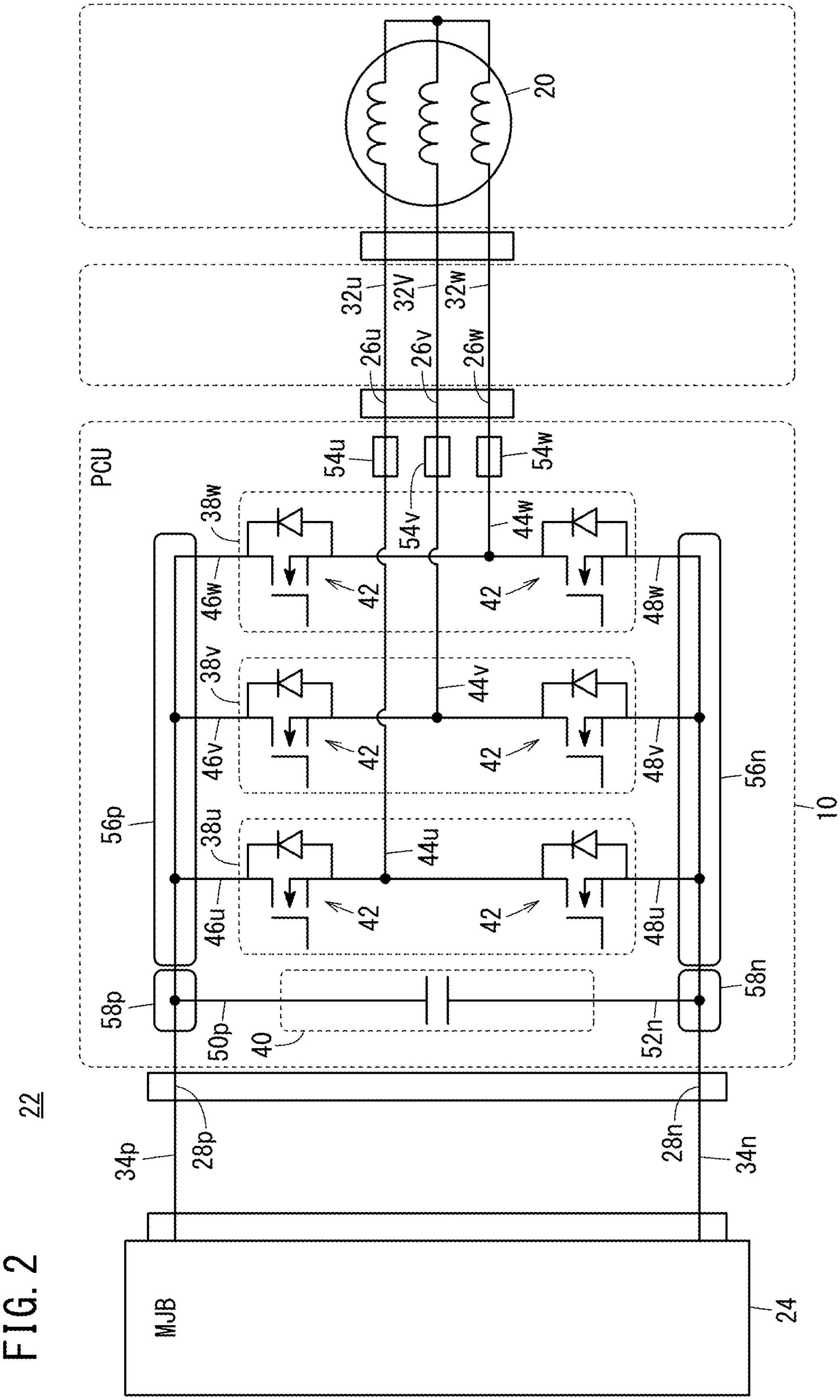
FIG. 2 is a circuit diagram of the power supply device.

FIG. 2 is a circuit diagram of the power supply device 22. FIG. 2 illustrates a circuit including the power generator 20 disposed on one of the left and right sides, the PCU 10 disposed on one of the left and right sides, and a MJB 24. The circuit of the PCU 10 will be described below.

The PCU 10 includes three external connection terminals 26*u*, 26*v*, 26*w*, and two external connection terminals 28*p*, 28*n*. The three external connection terminals 26*u*, 26*v*, 26*w*, and the two external connection terminals 28*p*, 28*n* are attached to a casing (not shown).

The external connection terminal 26*u* is connected to the power generator 20 via a U-phase wire 32*u*. The external connection terminal 26*v* is connected to the power generator 20 via a V-phase wire 32*v*. The external connection terminal 26*w* is connected to the power generator 20 via a W-phase wire 32*w*. The external connection terminal 28*p* is connected to the MJB 24 via a positive electrode line 34*p*. The external connection terminal 28*n* is connected to the MJB 24 via the negative electrode line 34*n*.

Figure 4:
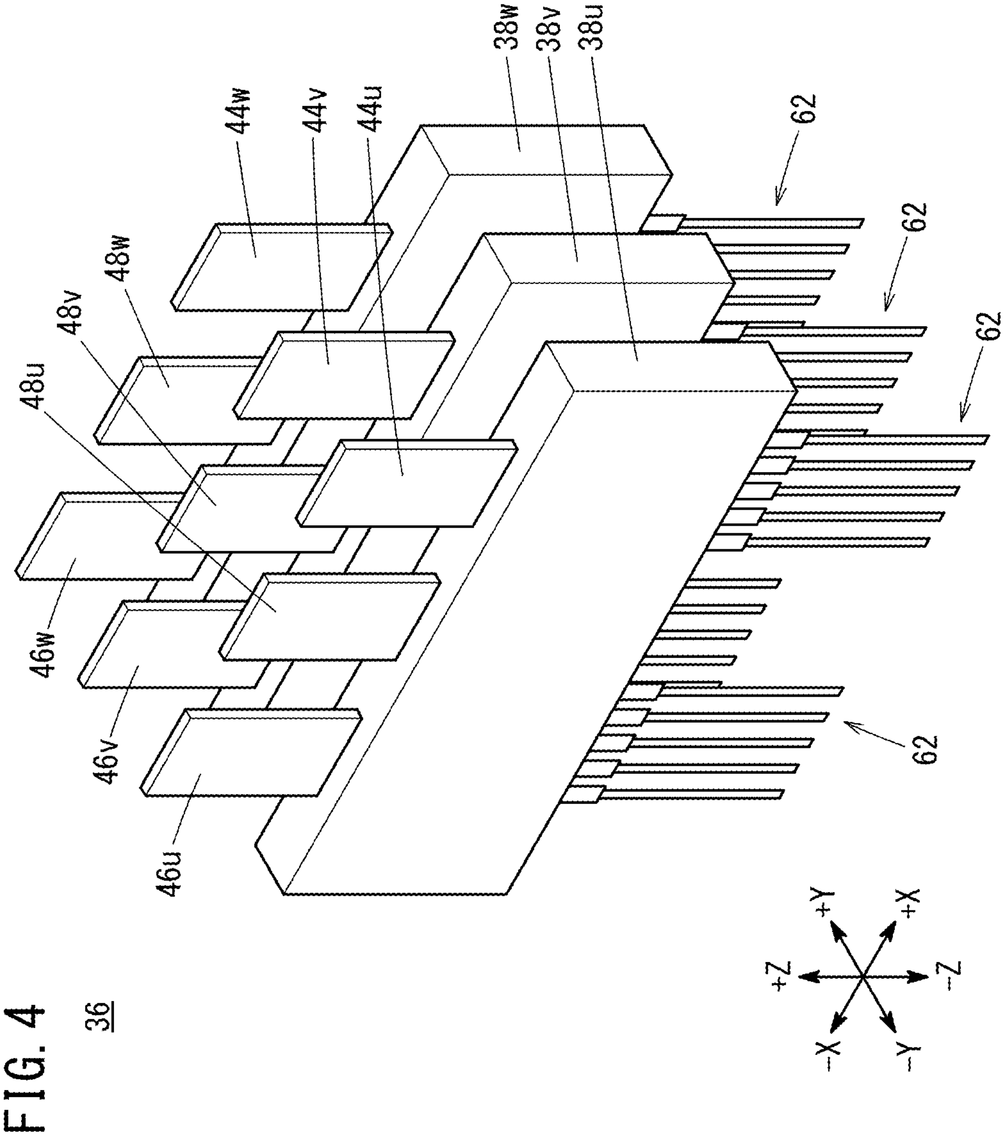
FIG. 4 is a perspective view of a power conversion unit.

The PCU 10 includes a U-phase power module 38*u*, a V-phase power module 38*v*, a W-phase power module 38*w*, and a smoothing capacitor 40. As shown in FIG. 4, the three power modules (38*u*, 38*v*, 38*w*) are also collectively referred to as a power conversion unit 36. The U-phase power module 38*u* includes two power devices 42, the U-phase terminal (first phase terminal) 44*u*, the positive terminal (first direct-current terminal) 46*u*, and the negative terminal (second direct-current terminal) 48*u*. The V-phase power module 38*v* includes two power devices 42, the V-phase terminal (second phase terminal) 44*v*, the positive terminal (first direct-current terminal) 46*v*, and the negative terminal (second direct-current terminal) 48*v*. The W-phase power module 38*w* includes two power devices 42, the W-phase terminal (third phase terminal) 44*w*, the positive terminal (first direct-current terminal) 46*w*, and the negative terminal (second direct-current terminal) 48*w*. Each power device 42 includes a switching element such as a MOSFET and a diode. The smoothing capacitor 40 includes a positive terminal 50*p* and a negative terminal 52*n*.

In the U-phase power module 38*u*, one of the two power devices 42 is connected to the positive terminal 46*u* and the U-phase terminal 44*u*. In the U-phase power module 38*u*, the other of the two power devices 42 is connected to the negative terminal 48*u* and the U-phase terminal 44*u*.

In the V-phase power module 38*v*, one of the two power devices 42 is connected to the positive terminal 46*v* and the V-phase terminal 44*v*. In the V-phase power module 38*v*, the other of the two power devices 42 is connected to the negative terminal 48*v* and the V-phase terminal 44*v*.

In the W-phase power module 38*w*, one of the two power devices 42 is connected to the positive terminal 46*w* and the W-phase terminal 44*w*. In the W-phase power module 38*w*, the other of the two power devices 42 is connected to the negative terminal 48*w* and the W-phase terminal 44*w*.

The U-phase terminal 44*u* of the U-phase power module 38*u* is connected to the external connection terminal 26*u* of the PCU 10 via the U-phase busbar (first busbar) 54*u*. The V-phase terminal 44*v* of the V-phase power module 38*v* is connected to the external connection terminal 26*v* of the PCU 10 via the V-phase busbar (second busbar) 54*v*. The W-phase terminals 44*w* of the W-phase power module 38*w* is connected to the external connection terminal 26*w* of the PCU 10 via the W-phase busbar (third busbar) 54*w*.

The positive terminal 46*u* of the U-phase power module 38*u*, the positive terminal 46*v* of the V-phase power module 38*v*, and the positive terminal 46*w* of the W-phase power module 38*w* are connected respectively to the external connection terminal 28*p* of the PCU 10 via the first positive busbar (fourth busbar) 56*p* and the second positive busbar 58*p*. The positive terminal 50*p* of the smoothing capacitor 40 is connected to the external connection terminal 28*p* of the PCU 10 via the second positive busbar 58*p*.

The negative terminal 48*u* of the U-phase power module 38*u*, the negative terminal 48*v* of the V-phase power module 38*v*, and the negative terminal 48*w* of the W-phase power module 38*w* are respectively connected to the external connection terminal 28*n* of the PCU 10 via the first negative busbar (fifth busbar) 56*n* and the second negative busbar 58*n*. The negative electrode terminal 52*n* of the smoothing capacitor 40 is connected to the external connection terminal 28*n* of the PCU 10 via the second negative busbar 58*n*.

4 Configuration of PCU 10

Figure 3:
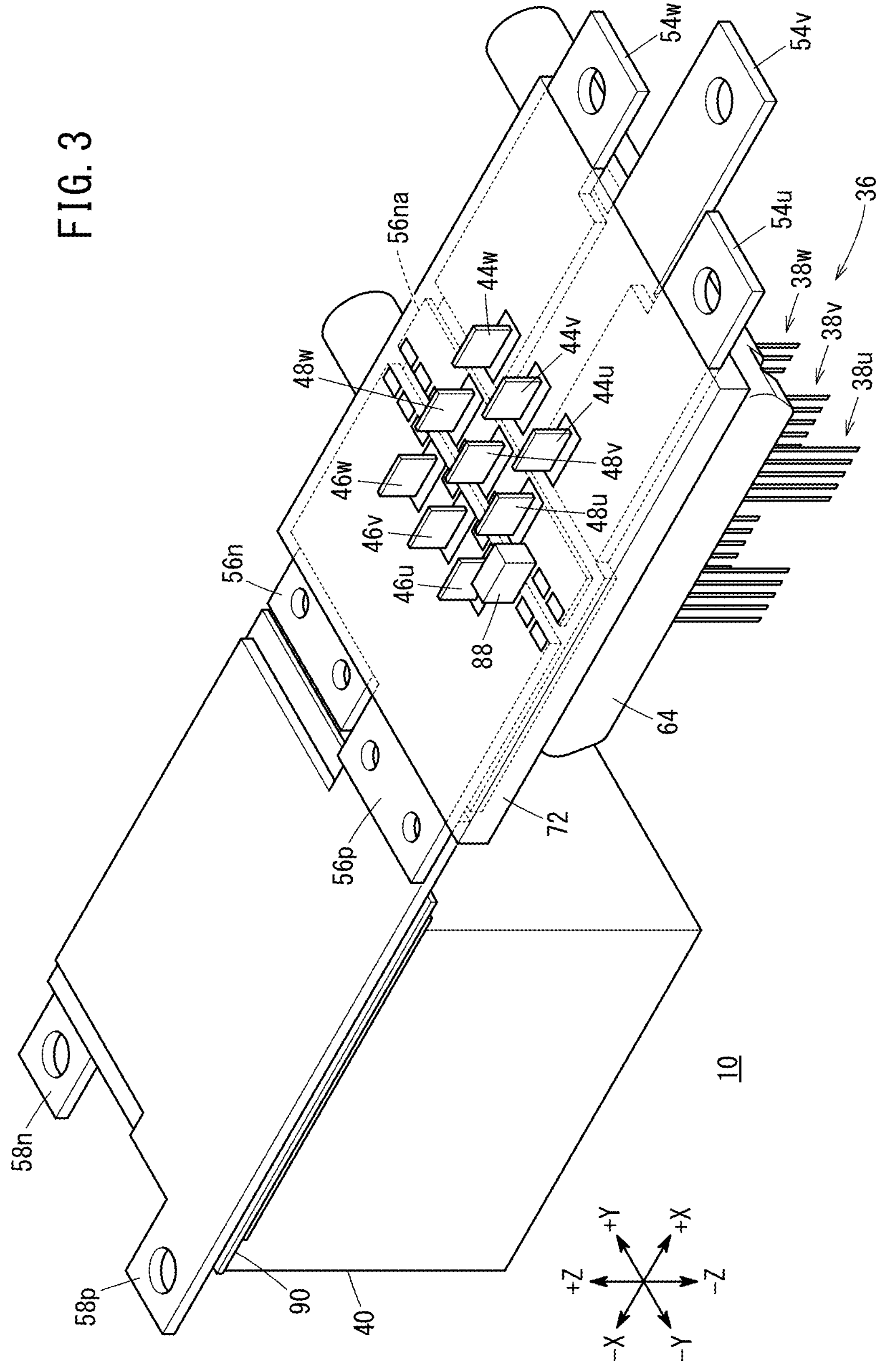
FIG. 3 is a perspective view of a Power Control Unit (PCU)

FIG. 3 is a perspective view of the PCU 10. FIG. 3 shows the PCU 10 with the external connection terminals 26*u*, 26*v*, 26*w*, 28*p*, 28*n* and the casing removed. In FIG. 3, arrows indicating the X direction, the Y direction, and the Z direction are shown. The X direction, the Y direction, and the Z direction are orthogonal to each other. One of the X directions is defined as a +X direction, and the other is defined as a −X direction. The same applies to the Y direction and the Z direction.

As described above, the PCU 10 includes the plurality of power modules (38*u*, 38*v*, 38*w*), the smoothing capacitor 40, and the plurality of busbars (54*u*, 54*v*, 54*w*, 56*p*, 56*n*, 58*p*, 58*n*). The PCU 10 further comprises a cooler 64.

FIG. 4 is a perspective view of the power conversion unit 36. Each of the U-phase power module 38*u*, the V-phase power module 38*v*, and the W-phase power module 38*w* has a shape of a flat plate extending in the X direction and the Z direction. The U-phase power module 38*u*, the V-phase power module 38*v*, and the W-phase power module 38*w* are arranged along the Y direction.

As described above, the U-phase power module 38*u* includes the two power devices 42 (FIG. 2). The two power devices 42 are sealed with an insulating material containing resin or the like. Thus, the two power devices 42 are integrated. The U-phase power module 38*u* includes the U-phase terminal 44*u*, the positive terminal 46*u*, the negative terminal 48*u*, and a plurality of signal terminals 62. Each of the U-phase terminal 44*u*, the positive terminal 46*u*, and the negative terminal 48*u* extends from the U-phase power module 38*u* in the +Z direction. The plurality of signal terminals 62 extend from the U-phase power module 38*u* in the −Z direction. Each of the signal terminals 62 is connected to an unillustrated driver circuit. The driver circuit amplifies signals output from an unillustrated controller. The driver circuit supplies amplified drive signals to the signal terminals 62. The V-phase power module 38*v* and the W-phase power module 38*w* are configured in the same manner as the U-phase power module 38*u*. Therefore, the descriptions thereof are omitted here.

Figure 5:
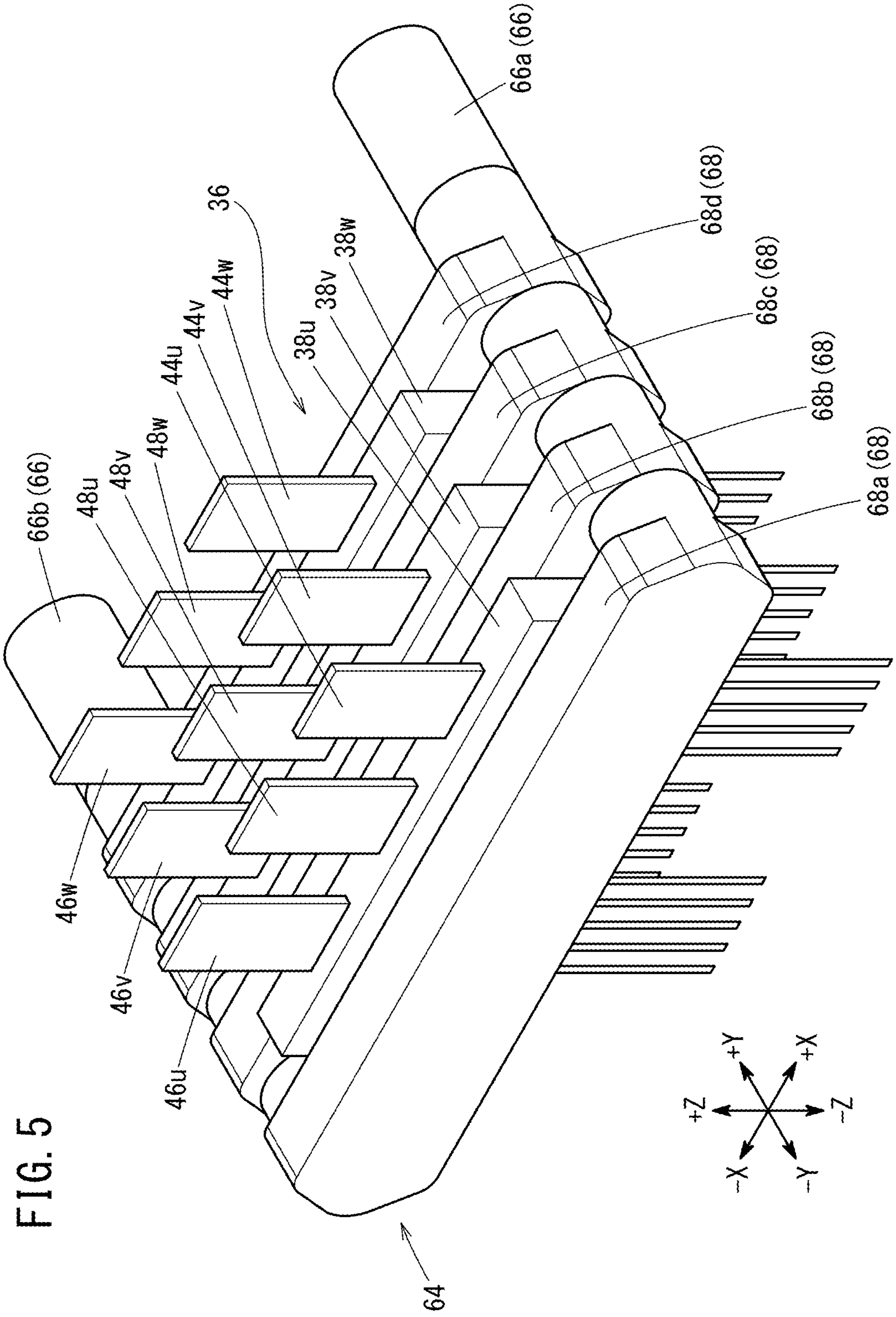
FIG. 5 is a perspective view of the power conversion unit and a cooler.

FIG. 5 is a perspective view of the power conversion unit 36 and the cooler 64. The cooler 64 includes two pipe sections 66 and four pipe sections 68. The two pipe sections 66 extend along the Y direction. The four pipe sections 68 extend along the X direction. The four pipe sections 68 extend between the two pipe sections 66. One end of each pipe section 68 is connected to one pipe section 66*a* of the two pipe sections 66. The other end of each pipe section 68 is connected to the other pipe section 66*b* of the two pipe sections 66. Thus, the two pipe sections 66 communicate with each other via the four pipe sections 68. Each of the two pipe sections 66 communicates with a pump (not shown).

The pipe section 68*a* of the four pipe sections 68 is in contact with an outer wall surface of the U-phase power module 38*u* facing in the −Y direction. The pipe section 68*b* of the four pipe sections 68 is in contact with an outer wall surface of the U-phase power module 38*u* facing in the +Y direction and also with an outer wall surface of the V-phase power module 38*v* facing in the −Y direction. The pipe section 68*c* of the four pipe sections 68 is in contact with an outer wall surface of the V-phase power module 38*v* facing in the +Y direction and also with an outer wall surface of the W-phase power module 38*w* facing in the −Y direction. The pipe section 68*d* of the four pipe sections 68 is in contact with the outer wall surface of the W-phase power module 38*w* facing in the +Y direction.

A cooling medium is caused to flow inside the cooler 64. For example, the cooling medium is discharged from the pump to the pipe section 66*a*, and is supplied from the pipe section 66*a* to each of the four pipe sections 68. Further, the cooling medium is discharged from the four pipe sections 68 to the pipe section 66*b* and is cooled by an unillustrated radiator or the like. The cooling medium having been cooled returns to the pump. The cooling medium absorbs heat of the plurality of power modules (38*u*, 38*v*, 38*w*) and radiates heat in the radiator. Thus, the plurality of power modules (38*u*, 38*v*, 38*w*) are cooled.

Figure 6:
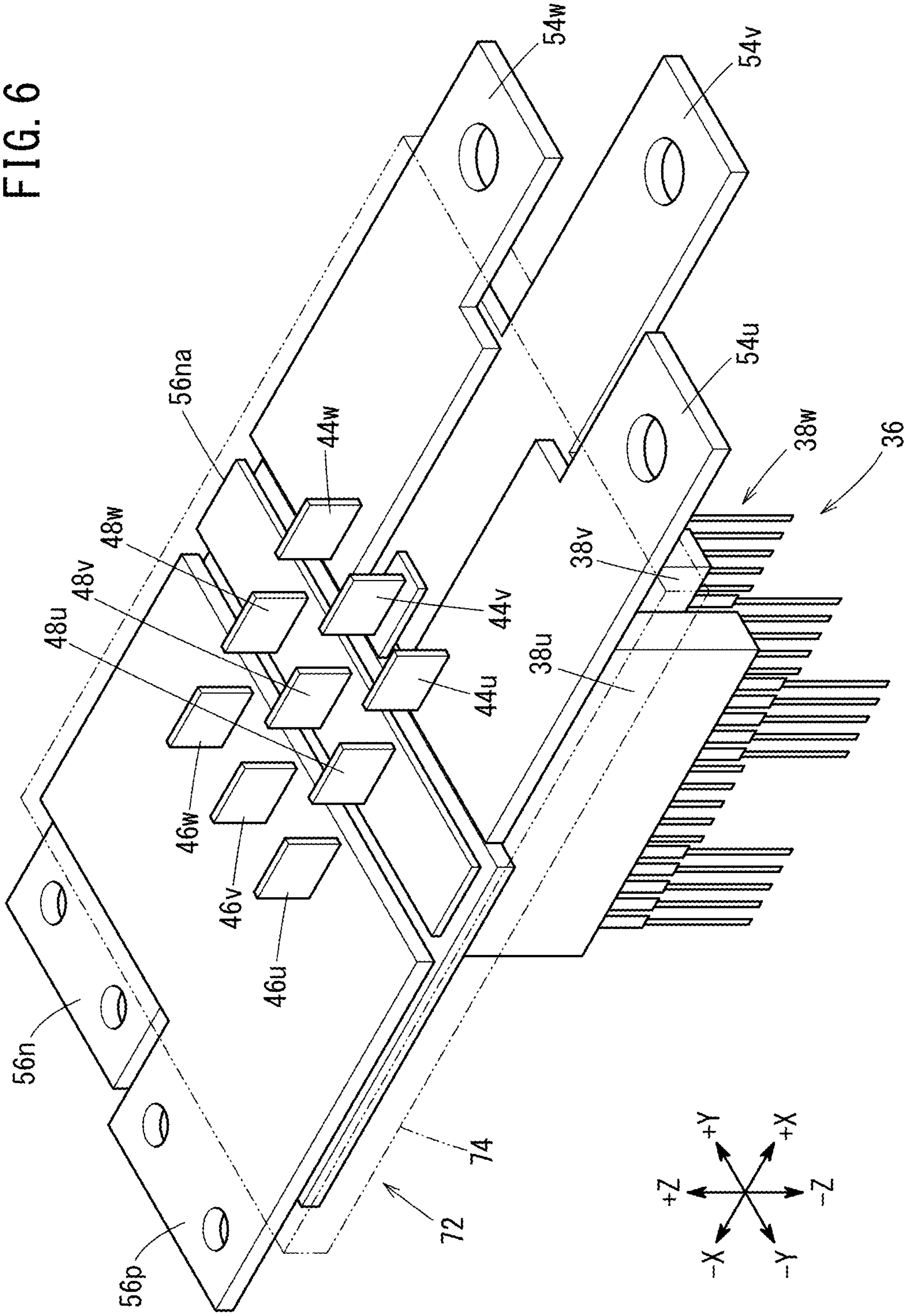
FIG. 6 is a perspective view of five busbars and the power conversion unit.
Figure 7:
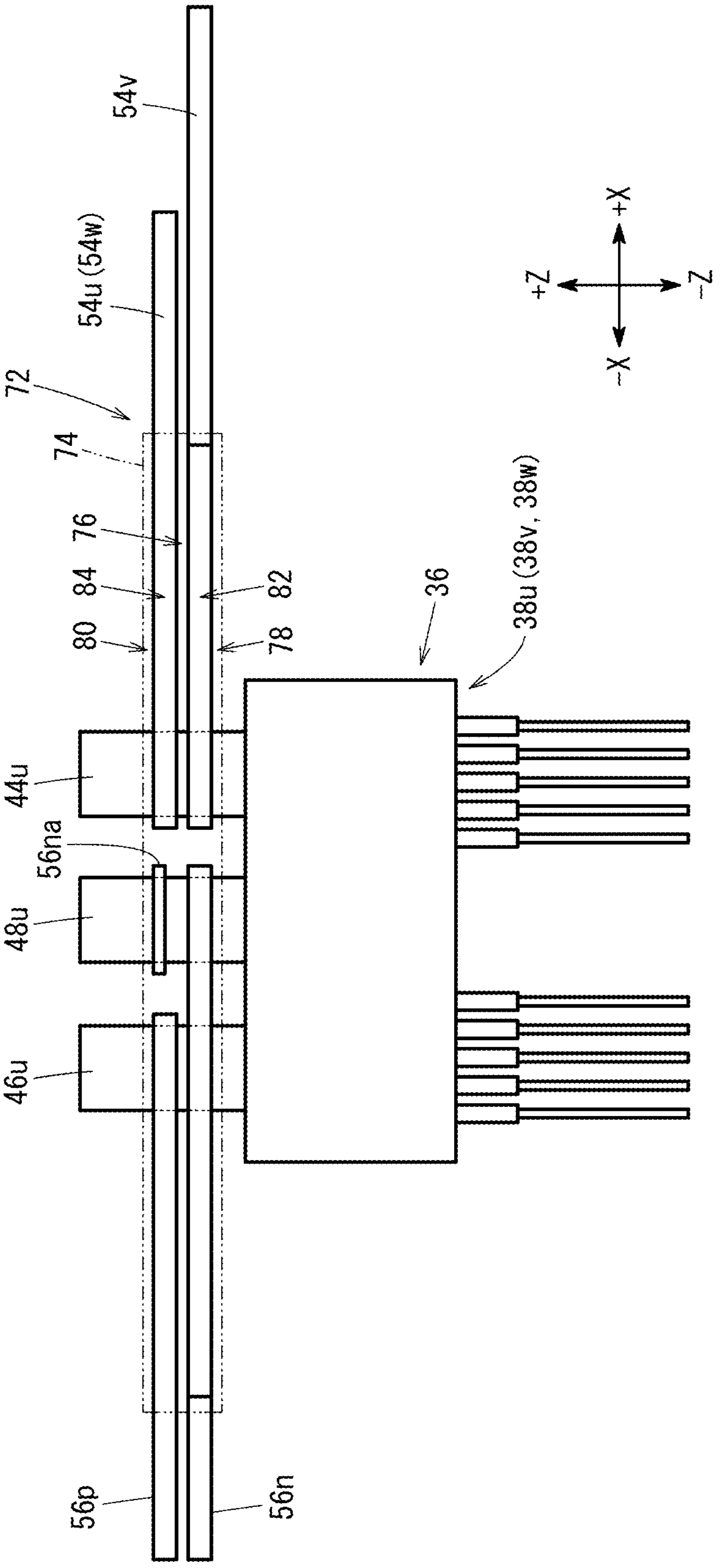
FIG. 7 is a side view of the five busbars and the power conversion unit.

FIG. 6 is a perspective view of five busbars (54*u*, 54*v*, 54*w*, 56*p*, 56*n*) and the power conversion unit 36. FIG. 7 is a side view of the five busbars (54*u*, 54*v*, 54*w*, 56*p*, 56*n*) and the power conversion unit 36. In FIG. 7, the V-phase power module 38*v* and the W-phase power module 38*w* are hidden behind the U-phase power module 38*u*. Therefore, in FIG. 7, the reference numerals relating to the V-phase power module 38*v* and the W-phase power module 38*w* are shown in parentheses. Similarly, in FIG. 7, the W-phase busbar 54*w* is hidden behind the U-phase busbar 54*u*. Therefore, in FIG. 7, the reference numeral relating to the W-phase busbar 54*w* is shown in parentheses.

As shown in FIG. 6, the U-phase busbar 54*u*, the V-phase busbar 54*v*, the W-phase busbar 54*w*, the first positive busbar 56*p*, and the first negative busbar 56*n* are disposed on a common insulating substrate 74. The U-phase busbar 54*u* is partially sealed by the insulating material forming the insulating substrate 74. Each of the V-phase busbar 54*v*, the W-phase busbar 54*w*, the first positive busbar 56*p*, and the first negative busbar 56*n* is also partially sealed in the same manner as the U-phase busbar 54*u*. The five busbars (54*u*, 54*v*, 54*w*, 56*p*, 56*n*) and the insulating substrate 74 form an integrated busbar board 72.

The busbar board 72 includes a plurality of insulating layers stacked along the Z direction. For example, as shown in FIG. 7, the busbar board 72 includes a first insulating layer 76, a second insulating layer 78, and a third insulating layer 80. The first insulating layer 76 is arranged between the second insulating layer 78 and the third insulating layer 80. In addition, the busbar board 72 includes a first conductive layer 82 and a second conductive layer 84. The first conductive layer 82 includes the V-phase busbar 54*v* and the first negative busbar 56*n*. The second conductive layer 84 includes the U-phase busbar 54*u*, the W-phase busbar 54*w*, the first positive busbar 56*p*, and a supplementary negative busbar 56*na*. The first negative busbar 56*n* of the first conductive layer 82 and the supplementary negative busbar 56*na* of the second conductive layer 84 are electrically connected to each other by a through hole or the like (not shown).

Each of the busbars (54*u*, 54*v*, 54*w*, 56*p*, 56*n*, 56*na*) may be formed of a metallic film (e.g., a copper film). In this case, the insulating substrate 74 may be a printed circuit board. Each of the busbars (54*u*, 54*v*, 54*w*, 56*p*, 56*n*, 56*na*) may be made of rolled metal (such as rolled copper). In this case, the metal is embedded in the insulating material.

The first conductive layer 82 is formed between the second insulating layer 78 and the first insulating layer 76. The second conductive layer 84 is formed between the first insulating layer 76 and the third insulating layer 80. In other words, the first insulating layer 76 is formed on the V-phase busbar 54*v* and the first negative busbar 56*n*. In addition, the U-phase busbar 54*u*, the W-phase busbar 54*w*, the first positive busbar 56*p*, and the supplementary negative busbar 56*na* are positioned on the first insulating layer 76. In other words, the first insulating layer 76 is interposed between the first conductive layer 82 and the second conductive layer 84.

Figure 8:
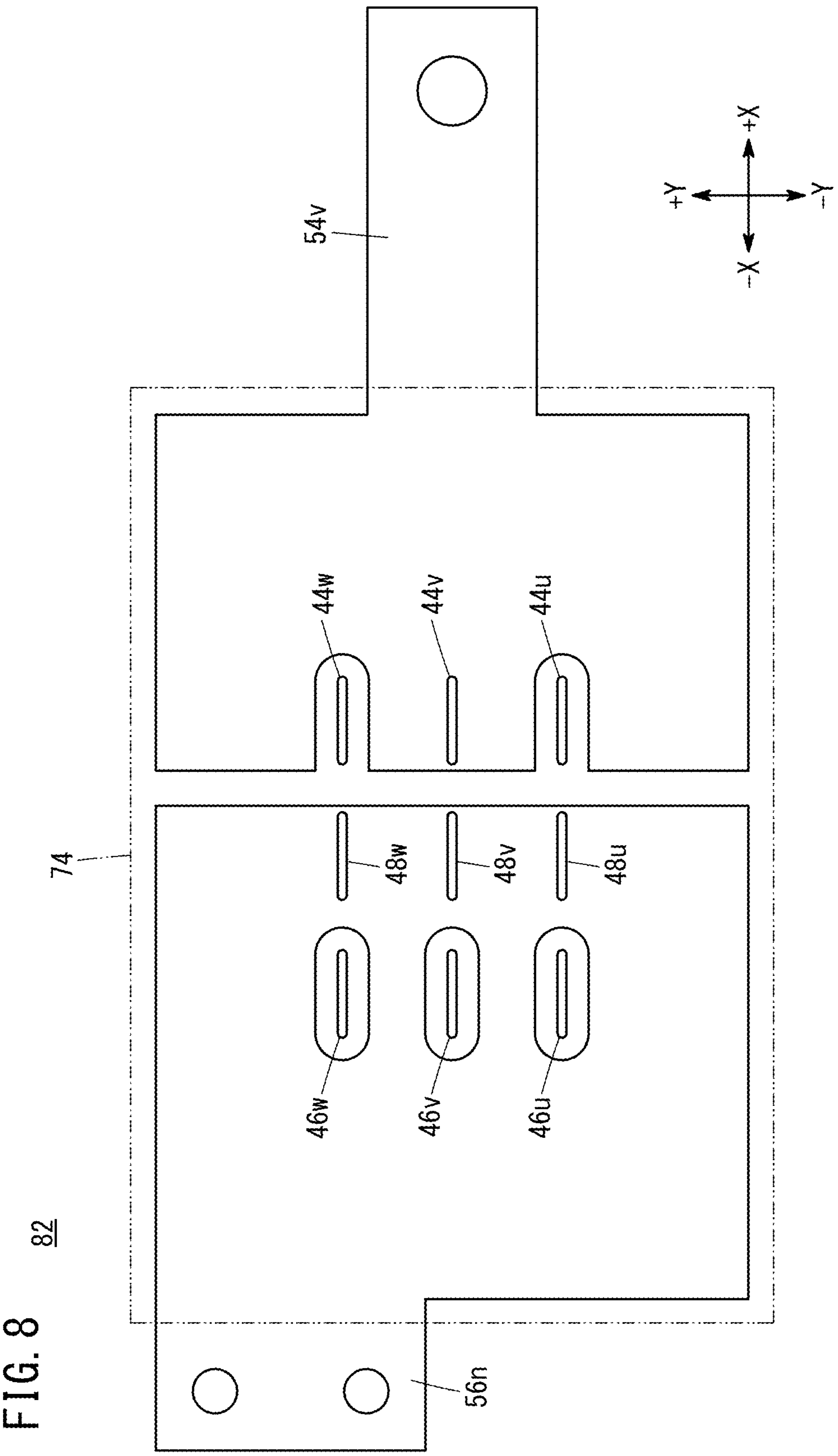
FIG. 8 is a plan view of a first conductive layer.

FIG. 8 is a plan view of a first conductive layer 82. As shown in FIG. 8, in the first conductive layer 82, the V-phase busbar 54*v* and the first negative busbar 56*n* are arranged along the X direction. The V-phase busbar 54*v* and the first negative busbar 56*n* are separated from each other. An insulating material forming the insulating substrate 74 is interposed between the V-phase busbar 54*v* and the first negative busbar 56*n*.

Figure 9:
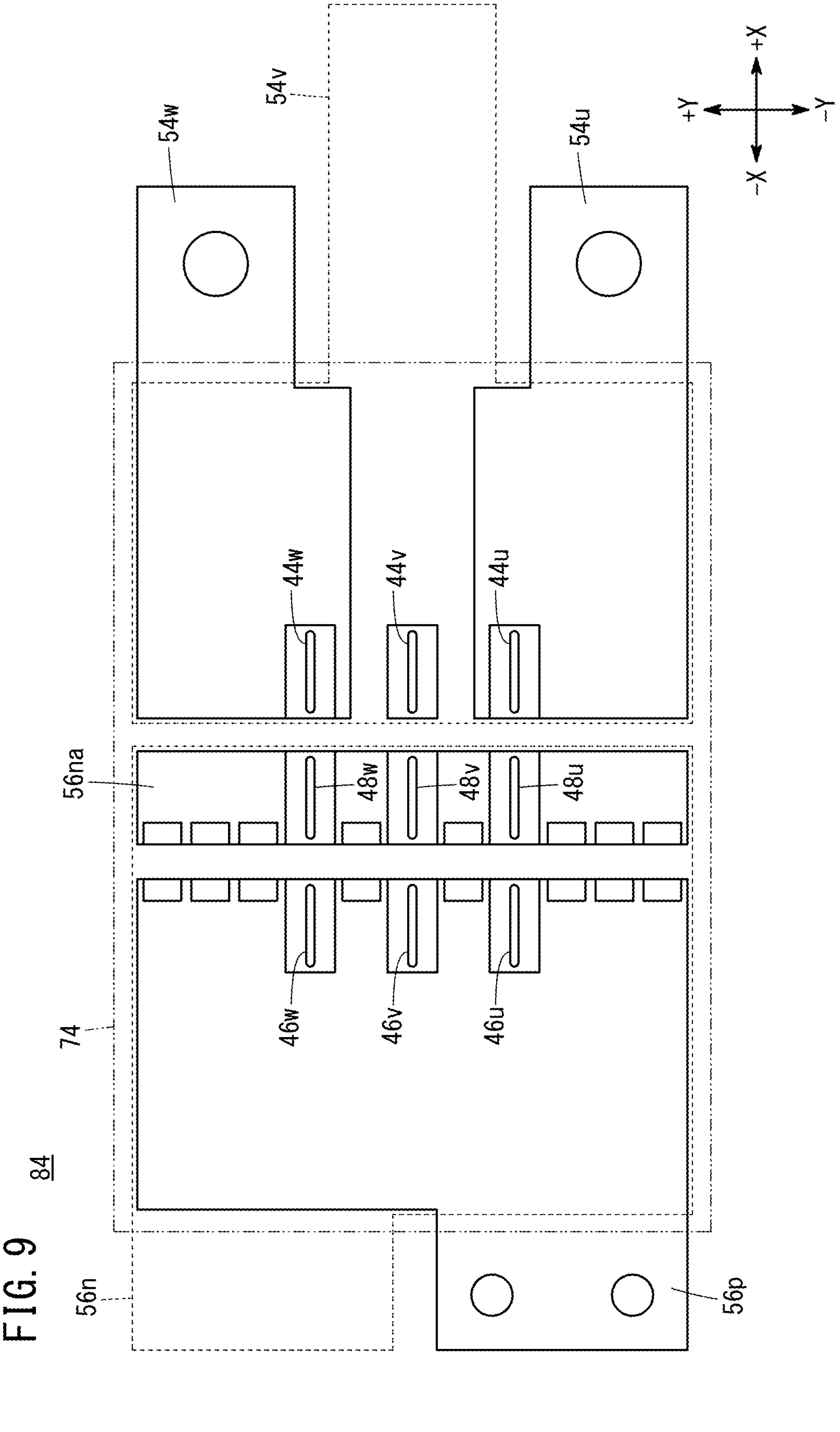
FIG. 9 is a plan view of a second conductive layer.

FIG. 9 is a plan view of the second conductive layer 84. As shown in FIG. 9, in the second conductive layer 84, the U-phase busbar 54*u* and the W-phase busbar 54*w* are arranged along the Y direction. The U-phase busbar 54*u*, the supplementary negative busbar 56*na*, and the first positive busbar 56*p* are arranged along the X direction. The W-phase busbar 54*w*, the supplementary negative busbar 56*na*, and the first positive busbar 56*p* are arranged along the X direction. The U-phase busbar 54*u*, the W-phase busbar 54*w*, the supplementary negative busbar 56*na*, and the first positive busbar 56*p* are separated from each other. The insulating material forming the insulating substrate 74 is interposed between each of the U-phase busbar 54*u*, the W-phase busbar 54*w*, the supplementary negative busbar 56*na*, and the first positive busbar 56*p*.

When viewed in the stacking direction, the U-phase busbar 54*u* and the V-phase busbar 54*v* overlap each other at least partially. In the present embodiment, as shown in FIG. 9, the U-phase busbar 54*u* and the V-phase busbar 54*v* overlap each other at least partially when viewed in the Z direction.

When viewed in the stacking direction, the W-phase busbar 54*w* and the V-phase busbar 54*v* overlap each other at least partially. In the present embodiment, as shown in FIG. 9, the W-phase busbar 54*w* and the V-phase busbar 54*v* overlap each other at least partially when viewed in the Z direction.

When viewed in the stacking direction, the first positive busbar 56*p* and the first negative busbar 56*n* overlap each other at least partially. In the present embodiment, as shown in FIG. 9, the first positive busbar 56*p* and the first negative busbar 56*n* overlap each other at least partially when viewed in the Z direction.

As shown in FIG. 3, each of the U-phase terminal 44*u*, the positive terminal 46*u*, and the negative terminal 48*u* of the U-phase power module 38*u* extends through the busbar board 72 and protrudes in the +Z direction. At the protruded portion, the U-phase terminal 44*u* is joined, by soldering or the like, to a portion of the U-phase busbar 54*u* exposed in the +Z direction. At the protruding portion, the positive terminal 46*u* is joined, by soldering or the like, to a portion of the first positive busbar 56*p* exposed in the +Z direction. At the protruding portion, the negative terminal 48*u* is joined, by soldering or the like, to a portion of the supplementary negative busbars 56*na* exposed in the +Z direction.

Similarly to the U-phase power module 38*u*, each of the V-phase terminal 44*v*, the positive terminal 46*v*, and the negative terminal 48*v* of the V-phase power module 38*v* extends through the busbar board 72 and protrudes in the +Z direction. At the protruded portion, the V-phase terminal 44*v* is joined, by soldering or the like, to a portion of the V-phase busbar 54*v* exposed in the +Z direction. At the protruding portion, the positive terminal 46*v* is joined, by soldering or the like, to a portion of the first positive busbar 56*p* exposed in the +Z direction. At the protruding portion, the negative terminal 48*v* is joined, by soldering or the like, to a portion of the supplementary negative busbars 56*na* exposed in the +Z direction.

Similarly to the U-phase power module 38*u*, each of the W-phase terminal 44*w*, the positive terminal 46*w*, and the negative terminal 48*w* of the W-phase power module 38*w* extends through the busbar board 72 and protrudes in the +Z direction. At the protruded portion, the W-phase terminal 44*w* is joined, by soldering or the like, to a portion of the W-phase busbar 54*w* exposed in the +Z direction. At the protruding portion, the positive terminal 46*w* is joined, by soldering or the like, to a portion of the first positive busbar 56*p* exposed in the +Z direction. At the protruding portion, the negative terminal 48*w* is joined, by soldering or the like, to a portion of the supplementary negative busbars 56*na* exposed in the +Z direction.

The end of the U-phase busbar 54*u* on the +X direction side is connected to the external connection terminal 26*u* (FIG. 2). The end of the V-phase busbar 54*v* on the +X direction side is connected to the external connection terminals 26*v* (FIG. 2). The end of the W-phase busbar 54*w* on the +X direction side is connected to the external connection terminals 26*w* (FIG. 2). The end of the first positive busbar 56*p* on the −X direction side is connected to the second positive busbar 58*p*. The end of the first negative busbar 56*n* on the −X direction side is connected to the second negative busbar 58*n*.

As shown in FIG. 3, the PCU 10 includes a snubber capacitor 88. The snubber capacitor 88 is disposed on the outer wall surface of the busbar board 72 on the +Z direction side. One end of the snubber capacitor 88 is joined, by soldering or the like, to a portion of the first positive busbar 56*p* exposed in the +Z direction. The other end of the snubber capacitor 88 is joined, by soldering or the like, to a portion of the supplementary negative busbar 56*na* exposed in the +Z direction.

As shown in FIG. 3, the second positive busbar 58*p* and the second negative busbar 58*n* are stacked along the Z direction. The insulating body 90 is interposed between the second positive busbar 58*p* and the second negative busbar 58*n*. The second positive busbar 58*p* is connected to the positive electrode terminal 50*p* (FIG. 2) of the smoothing capacitor 40. The second positive busbar 58*p* is connected to the external connection terminal 28*p* (FIG. 2). The second negative busbar 58*n* is connected to the negative electrode terminal 52*n* (FIG. 2) of the smoothing capacitor 40. The second negative busbar 58*n* is connected to the external connection terminal 28*n* (FIG. 2).

In the present embodiment, the first insulating layer 76 is positioned on the V-phase busbar 54*v*, and the U-phase busbar 54*u* and the W-phase busbar 54*w* are positioned on the first insulating layer 76. Instead, the first insulating layer 76 may be positioned on the U-phase busbar 54*u*, and the V-phase busbar 54*v* and the W-phase busbar 54*w* may be positioned on the first insulating layer 76. Further, the first insulating layer 76 may be positioned on the W-phase busbar 54*w*, and the U-phase busbar 54*u* and the V-phase busbar 54*v* may be positioned on the first insulating layer 76. In these embodiments, two of the three busbars (the U-phase busbar 54*u*, the V-phase busbar 54*v*, and the W-phase busbar 54*w*) are arranged in the +Z direction, and one of the three busbars is arranged in the −Z direction. Instead, one of the three busbars (the U-phase busbar 54*u*, the V-phase busbar 54*v*, and the W-phase busbar 54*w*) may be arranged in the +Z direction, and two of the three busbars may be arranged in the −Z direction.

In the present embodiment, the first insulating layer 76 is formed on the first negative busbar 56*n*, and the first positive busbar 56*p* is positioned on the first insulating layer 76. Instead, the first insulating layer 76 may be formed on the first positive busbar 56*p*, and the first negative busbar 56*n* may be positioned on the first insulating layer 76.

According to the present embodiment, the busbars (54*u*, 54*v*, 54*w*, 56*p*, 56*n*) are insulated from each other by the insulating material forming the insulating substrate 74, and thus the distances between the busbars can be made shorter than in the case where spaces are provided between the busbars. Therefore, the power conversion device 10 can be downsized.

According to the present embodiment, the busbars (54*u*, 54*v*, 54*w*, 56*p*, 56*n*) disposed in the different layers overlap each other when viewed in the stacking direction. In the case of arranging two busbars in an area, the size of each busbar can be larger if the two busbars overlap each other than if the two busbars do not overlap each other. That is, according to the present embodiment, since each busbar can be increased in size, the heat dissipation of the busbars can be improved. On the other hand, in the case of arranging two busbars of the same size on one substrate, the size of the substrate can be smaller if the two busbars overlap each other than if the two busbars do not overlap each other. That is, according to the present embodiment, the substrate can be made small, and thus the space around the substrate can be effectively used.

According to the present embodiment, the three busbars (54*u*, 54*v*, 54*w*) and the two busbars (56*p*, 56*n*) are integrated. Therefore, easy assembling of the PCU 10 can be achieved.

Since the snubber capacitor 88 is disposed in the vicinity of the power conversion unit 36, the present embodiment can elicit high switching performance of the power conversion unit 36.

5 Supplementary Note

In relation to the above-described embodiment, the following Supplementary Notes are further disclosed.

Supplementary Note 1

The power conversion device (10) according to the present disclosure includes the power conversion unit (36) configured to convert three-phase alternating-current power, which is supplied from a three-phase alternating-current power source (20), into direct-current power; the insulating substrate (74) formed of an insulating material; the first busbar (54*u*) connected to the first phase terminal (44*u*) of the power conversion unit, the insulating substrate being provided with the first busbar; the second busbar (54*v*) connected to the second phase terminal (44*v*) of the power conversion unit, the insulating substrate being provided with the second busbar; and the third busbar (54*w*) connected to the third phase terminal (44*w*) of the power conversion unit, the insulating substrate being provided with the third busbar, wherein the insulating substrate includes the plurality of insulating layers (76, 78, 80), the first insulating layer (76) of the plurality of insulating layers is positioned on the second busbar, the first busbar and the third busbar are positioned on the first insulating layer, and the first busbar, the second busbar, and the third busbar are mutually insulated by the insulating material forming the insulating substrate.

In accordance with such a configuration of Supplementary Note 1, since the busbars are insulated from each other by the insulating material forming the insulating substrate, the distances between the busbars can be made shorter than in the case where the busbars are insulated by being spaced from each other. Therefore, the power conversion device can be downsized.

Supplementary Note 2

In the power conversion device according to Supplementary Note 1, the first busbar and the second busbar may overlap each other at least partially when viewed in the stacking direction of the insulating layers.

Supplementary Note 3

In the power conversion device according to Supplementary Note 2, the third busbar and the second busbar may overlap each other at least partially when viewed in the stacking direction of the insulating layers.

According to the configurations of Supplementary Notes 2 and 3, the busbars in different layers overlap each other when viewed in the stacking direction. In the case of arranging two busbars in one area, the size of each busbar can be larger if the two busbars overlap each other than if the two busbars do not overlap each other. That is, according to the present embodiment, since each busbar can be increased in size, the heat dissipation of the busbars can be improved. On the other hand, in the case of arranging two busbars of the same size in one substrate, the size of the substrate can be smaller if the two busbars overlap each other than if the two busbars do not overlap each other. That is, according to the present embodiment, the substrate can be made small, and thus the space around the substrate can be effectively used.

Supplementary Note 4

In the power conversion device according to any one of Supplementary Notes 1 to 3, each of the first phase terminal, the second phase terminal, and the third phase terminal may extend in the stacking direction of the insulating layers and pass through the insulating substrate.

Supplementary Note 5

The power conversion device according to Supplementary Note 1 may further include the fourth busbar (56*p*) connected to the first direct-current terminal (46*u*, 46*v*, 46*w*) of the power conversion unit, the insulating substrate being provided with the fourth busbar, and the fifth busbar (56*n*) connected to the second direct-current terminal (48*u*, 48*v*, 48*w*) of the power conversion unit, the insulating substrate being provided with the fifth busbar, wherein the first insulating layer may be positioned on the second busbar and the fifth busbar, the first busbar, the third busbar and the fourth busbar are positioned on the first insulating layer, and the first busbar, the second busbar, the third busbar, the fourth busbar, and the fifth busbar are mutually insulated by the insulating material forming the insulating substrate.

According to the configuration of Supplementary Note 5, the first to third busbars and the fourth and fifth busbars are integrated. Therefore, the assemblability of the power conversion device can be improved.

Supplementary Note 6

In the power conversion device according to Supplementary Note 5, each of the first phase terminal, the second phase terminal, the third phase terminal, the first direct-current terminal, and the second direct-current terminal may extend in a stacking direction of the insulating layers and pass through the insulating substrate.

Supplementary Note 7

The power conversion device according to Supplementary Note 5 or 6 may further include the snubber capacitor (88) having one end connected to the fourth busbar and the other end connected to the fifth busbar.

In accordance with the configuration of Supplementary Note 7, since the snubber capacitor is arranged in the vicinity of the power conversion unit, the present embodiment can elicit high switching performance of the power conversion unit.

Supplementary Note 8

In the power conversion device according to any one of Supplementary Notes 1 to 7, the insulating substrate may be a printed substrate.

According to the configuration of Supplementary Note 8, such the busbars are thinned, and thus the power conversion device can be further downsized.

Although concerning the present disclosure, a detailed description thereof has been presented above, the present disclosure is not necessarily limited to the individual embodiments described above. These embodiments may be subjected to various additions, substitutions, modifications, partial deletions and the like, within a range that does not deviate from the essence and gist of the present disclosure, or the spirit of the present disclosure as derived from the contents described in the claims and equivalents thereof. Further, the embodiments can also be implemented together in combination. For example, in the above-described embodiments, the order of each of the operations and the order of each of the processes are illustrated as examples, and the present invention is not necessarily limited to these features. The same also applies to cases in which numerical values or mathematical expressions are used in the description of the aforementioned embodiments.

The invention claimed is:

1. A power conversion device comprising: a power conversion unit configured to convert three-phase alternating-current power, which is supplied from a three-phase alternating-current power source, into direct-current power;

an insulating substrate formed of an insulating material;

a first busbar connected to a first phase terminal of the power conversion unit, the insulating substrate being provided with the first busbar;

a second busbar connected to a second phase terminal of the power conversion unit, the insulating substrate being provided with the second busbar; and a third busbar connected to a third phase terminal of the power conversion unit, the insulating substrate being provided with the third busbar, wherein the insulating substrate includes a plurality of insulating layers, a first insulating layer of the plurality of insulating layers is positioned on the second busbar, the first busbar and the third busbar are positioned on the first insulating layer, and the first busbar, the second busbar, and the third busbar are mutually insulated by the insulating material forming the insulating substrate.

2. The power conversion device according to claim 1, wherein the first busbar and the second busbar overlap each other at least partially when viewed in a stacking direction of the insulating layers.

3. The power conversion device according to claim 2, wherein the third busbar and the second busbar overlap each other at least partially when viewed in the stacking direction of the insulating layers.

4. The power conversion device according to claim 1, wherein each of the first phase terminal, the second phase terminal, and the third phase terminal extends in a stacking direction of the insulating layers and passes through the insulating substrate.

5. The power conversion device according to claim 1, further comprising:

a fourth busbar connected to a first direct-current terminal of the power conversion unit, the insulating substrate being provided with the fourth busbar, and the fifth busbar connected to a second direct-current terminal of the power conversion unit, the insulating substrate being provided with the fifth busbar, wherein the first insulating layer is positioned on the second busbar and the fifth busbar, the first busbar, the third busbar and the fourth busbar are positioned on the first insulating layer, and the first busbar, the second busbar, the third busbar, the fourth busbar, and the fifth busbar are mutually insulated by the insulating material forming the insulating substrate.

6. The power conversion device according to claim 5, wherein each of the first phase terminal, the second phase terminal, the third phase terminal, the first direct-current terminal, and the second direct-current terminal extends in a stacking direction of the insulating layers and passes through the insulating substrate.

7. The power conversion device according to claim 5, further comprising:

a snubber capacitor having one end connected to the fourth busbar and another end connected to the fifth busbar.

8. The power conversion device according to claim 1, wherein the insulating substrate is a printed substrate.

* * * * *